United States Patent [19]
Walker

[11] Patent Number: 5,970,078
[45] Date of Patent: Oct. 19, 1999

[54] LASER DRIVE CIRCUIT

[75] Inventor: Stuart Douglas Walker, Colchester, United Kingdom

[73] Assignee: British Telecommunications public limited company, London, United Kingdom

[21] Appl. No.: 08/981,707

[22] PCT Filed: Jun. 20, 1996

[86] PCT No.: PCT/GB96/01474

§ 371 Date: Jan. 9, 1998

§ 102(e) Date: Jan. 9, 1998

[87] PCT Pub. No.: WO97/01202

PCT Pub. Date: Jan. 9, 1997

[30] Foreign Application Priority Data

Jun. 23, 1995 [GB] United Kingdom .................. 95304448

[51] Int. Cl.⁶ .................................................... H01S 3/133

[52] U.S. Cl. .............................................................. 372/38
[58] Field of Search .................................. 372/38, 29, 31

[56] References Cited

U.S. PATENT DOCUMENTS

5,123,024  6/1992  Dowd et al. ............................... 372/38
5,761,231  6/1998  Ofenloch et al. .......................... 372/38

FOREIGN PATENT DOCUMENTS

A-0434466  6/1991  European Pat. Off. .
A-3940205  6/1990  Germany .

*Primary Examiner*—James W. Davie
*Attorney, Agent, or Firm*—Nixon & Vanderhye P.C.

[57] ABSTRACT

A laser diode is driven by a first, integrating, amplifier receiving a d.c. reference voltage $V_{ref}$ and negative feedback from a back-facet photodiode, and by a second, wideband, amplifier receiving the data and the negative feedback.

8 Claims, 3 Drawing Sheets

LASER DRIVE CIRCUIT

BACKGROUND OF THE INVENTION

1. Field of the Invention

The present invention relates to laser drive circuits, and more particularly to drive circuits to which a modulating signal may be applied.

2. Related Art

Before considering such circuits in detail, it will be helpful to examine the laser behaviour. FIG. 1 shows a graph of light output power against input current for a typical semiconductor laser diode. The curve marked A illustrates a typical characteristic at room temperature. It is characterised by a slope S and by a turn on current $I_t$. This characteristic is however temperature-dependent, and typical graphs for higher and lower temperatures are shown in curves B and C respectively. It is apparent from an examination of these graphs that in order to drive the laser with a modulating signal it is necessary to provide some standing current to bring the laser into an operating region, and to vary this current in accordance with the modulating signal. Reference D indicates a typical range of drive current for operation on the curve A, in which it can be seen that the light output varies between substantially zero and some desired maximum. It can also be observed that applying this same range of current at the higher temperature (Graph B) results in a lower maximum power output, and also results in the laser being driven considerably below cut-off. This is particularly unsatisfactory since, once driven below cut-off, an increasing current to being the device back into the operating region introduces a delay which can degrade performance when attempting to modulate with a high bit-rate digital signals. On the other hand, applying the same range of currents to the low temperature case (Graph C), a much higher light output is obtained, but with a considerable minimum light output (this is referred to as a low extinction ratio); this however causes problems in demodulation.

One solution to this problem is to use a Peltier cooler with appropriate control circuitry to maintain the temperature of the device reasonably constant. This however results in an increase in expense.

Variations in turn-on threshold may be accommodated by the use of a known mean-power controller, a schematic diagram of which is shown in FIG. 2. Here a laser diode 1 is driven with a current I and produces a light output L=S.I Watts. The light output is sensed by a back facet monitor photodiode 2 which drives a current of K.L. amps into a load resistor 3 of resistance R. The mean light output is determined by a voltage reference source 4 producing a voltage $V_{ref}$ and the voltage developed across the load resistor 3 is compared by an integrated transconductance amplifier 5 with the voltage developed across the load resistor 3 to control the current fed to the diode. A modulating current is fed to the laser diode 1 from an external current source connected at an input 6.

If the amplifier 5 has a transconductance-bandwidth product G, then the laser output ignoring any modulation input is:

$$L = \frac{V_{ref} + V_S}{K.R.\left(1 + \frac{j\omega}{G.K.S.R.}\right)}$$

We see that the light output for $\omega=0$ is independent of S, and thus the mean power setting is held constant. In the event that a modulating current $I_{data}$ is applied to the input 6, the light output is then given by:

$$L = \frac{V_{ref} + V_s}{K.R.\left(1 + \frac{j\omega}{G.K.S.R.}\right)} + \frac{S.I_{data}\frac{j\omega}{G.K.S.R}}{1 + \frac{j\omega}{G.K.S.R}}$$

We see that here at high frequencies the gain is dependent on S, and thus the situation shown in FIG. 3 obtains, where the operating regions for the same current drive swing are shown. At high temperatures a poor extinction ratio is obtained, whereas at low temperatures the laser can be biased below cut-off, or even reversed biased, with the turn-on delay penalty. It can moreover be seen that the gain for low frequency data is low, falling to zero at d.c., the feedback control of the amplifier 5 effectively removing the d.c. component from the data. Thus this type of drive is suitable only for data having a symmetrical waveform; specifically it is extremely unsuitable for burst data drives such as may be used in TDMA systems such as passive optical networks.

According to the present invention there is provided a laser driver comprising a data input for receiving data signals; means for providing a feedback signal representative of the laser light output; a first amplifier having gain at d.c. and lower frequencies connected to receive the data signals, a d.c. reference signal and the feedback signal to provide current to the laser; and a second amplifier having gain at higher frequencies connected to receive the data signals the feedback signal to provide current to the laser.

Preferably the first amplifier is an integrating amplifier having, below a threshold frequency, a higher gain than the second amplifier and, above the threshold frequency, a lower gain than the second amplifier.

If desired the driver may have gain adjustment means whereby the gain provided by the driver to data signals may be rendered equal at d.c. and at a frequency above the passband of the first amplifier.

BRIEF DESCRIPTION OF THE DRAWINGS

Some embodiments of the invention will now be described by way of example with reference to the accompanying drawings.

DETAILED DESCRIPTION OF EXEMPLARY EMBODIMENTS

Figure 1:
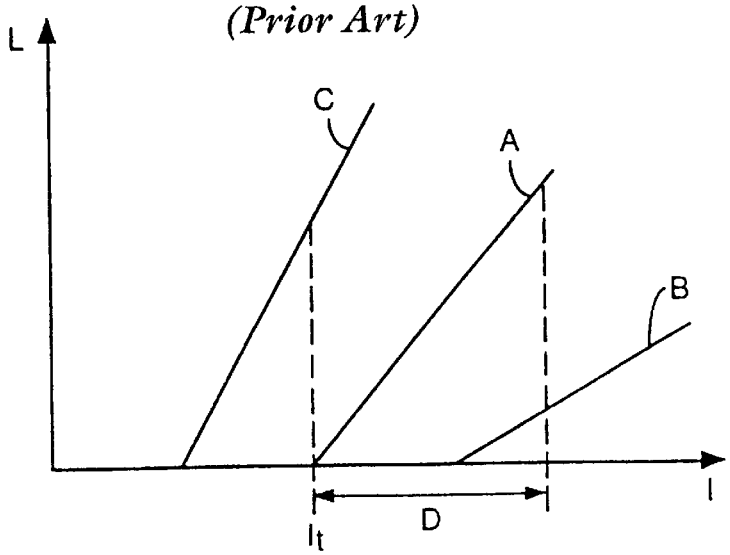
FIGS. 1–3 describe various features of the prior art.

In FIG. 4, a laser diode 1 is again shown, with a back facet monitor photodiode 2 and its load resistor 3, a voltage reference source 4 and integrating transconductance amplifier 5. In this case however the amplifier 5 receives (at its inverting input) not only the voltage $V_{ref}$ from the reference source 4 but also the data $V_{in}$ from a data input 10. Its noninverting input is connected to receive the feedback voltage at the resistor 3.

Moreover a second, wideband, amplifier 11 is also provided, with an operational amplifier 12 which is connected to receive the same feedback voltage at its noninverting input and the data $V_{in}$ at its inverting input via an input resistor 13; the voltage gain of this amplifier is determined by this input resistor and a feedback resistor 14. The amplifier drives a current into the laser diode 1 via a load resistor 15.

In operation, the amplifier 5 drives the diode 1 with a current (in the direction shown by the arrow in FIG. 4) of $I_1$. With the notation used previously this current is given by:

$$I_1 = (V_{in} + V_{ref} - KSIR + V_S) \cdot G/j\omega$$

On the other hand to obtain the voltage $V_2$ output from the wideband amplifier 11, we sum the currents at the inverting input, where $R_{in}$ and $R_{fb}$ are the values of the input and feedback resistors 13,14.

$$\frac{V_{in} - (KSIR - V_S)}{R_{in}} + \frac{V_2 - (KSIR - V_S)}{R_{fo}} = 0$$

$$\text{hence } V_2 = -\frac{R_{fo}}{R_{in}} V_{in} + \left(1 + \frac{R_{fo}}{R_{in}}\right)(KSIR - V_s)$$

and, if $R_L$ is the value of the load resistor 15, $$I_2 = -\frac{V_2}{R_L} = \frac{R_{fo}}{R_{in}} \frac{V_{in}}{R_L} - \left(1 + \frac{R_{fo}}{R_{in}}\right)\frac{(KSIR - V_S)}{R_L}$$

So that the total laser diode current is $$I = I_1 + I_2 = \frac{V_{in}}{R_L} \frac{R_{fo}}{R_{in}} - \frac{(KSIR - V_S)}{R_L}\left(1 + \frac{R_{fo}}{R_{in}}\right) + \frac{G}{j\omega}(V_{in} + V_{ref} + V_S)$$

Simplifying, $$I = \frac{\frac{V_{in}}{R_L}\frac{R_{fo}}{R_{in}} + \frac{V_S}{R_L}\left(1 + \frac{R_{fo}}{R_{in}}\right) + \frac{G}{j\omega}(V_{in} + V_{ref} + V_S)}{1 + KSR\left(\frac{G}{j\omega} + \frac{1 + R_{fo}/R_{in}}{R_L}\right)} \quad (6)$$

The time varying component of this in terms of the a.c. component $V_{insc}$ of the input signal is $$I_{ac} = \frac{V_{inac}\left(\frac{R_{fo}}{R_L R_{in}} + \frac{G}{j\omega}\right)}{1 + KSR\left(\frac{G}{j\omega} + \frac{1}{R_L} + \frac{R_{fo}}{R_L R_{in}}\right)} \quad (7)$$

$$I_{ac} = \frac{V_{inac}\left(1 + \frac{R_{in}}{R_{fo}} \frac{GR_L}{j\omega}\right) / KSR}{\frac{R_{in}}{R_{fo}}\left(\frac{R_L}{KSR} + 1 + \frac{GR_L}{j\omega}\right) + 1} \quad (8)$$

And the corresponding light output is $$L_{ac} = \frac{V_{inac}\left(1 + \frac{R_{in}}{R_{fo}} \frac{GR_L}{j\omega}\right) / KR}{\frac{R_{in}}{R_{fo}}\left(\frac{R_L}{KSR} + 1 + \frac{GR_L}{j\omega}\right) + 1} \quad (9)$$

We see that if $R_L/KSR$ is much less than unity, then this expression is independent of the laser slope S; moreover if $R_{in}(1+R_L/KSR)/R_{fb}$ is much less than unity the light output is solely dependent on fixed parameters of photodiode load R, and optical feedback transfer function K. In fact a compromise here is necessary as excessively large values of R can cause a tendency towards instability. Nevertheless, a worthwhile reduction in slope sensitivity can be obtained.

The d.c. component of the current I in terms of the d.c. component $V_{indc}$ is given by $$I_{dc} = \frac{V_{indc} + V_{ref} + V_S}{KSR} \quad (10)$$

and the light output $$L_{dc} = \frac{V_{indc} + V_{ref} + V_S}{KR} \quad (11)$$

which is again slope-independent and moreover maintains the d.c. component of the input.

In operation, the laser bias point is set by adjustment of $V_{ref}$. As the circuit is d.c. coupled, the usual bias setting would be just at threshold. This setting would correspond to $V_{in}=0$ volts. Any changes in the laser threshold are tracked by the transconductance amplifier 5. With low-frequency modulation, virtually all the laser drive is provided by this amplifier; as the frequency increases the contribution from the wideband amplifier 11 becomes more significant and the proportion of drive current carried by it increases smoothly as the ratio of its gain (which is substantially constant) to that of the transconductance amplifier (which is inversely proportional to frequency) increases. Thus the low-speed device provides the standing laser threshold bias whilst the wideband amplifier contributes just the high-frequency modulation component.

Figure 4:
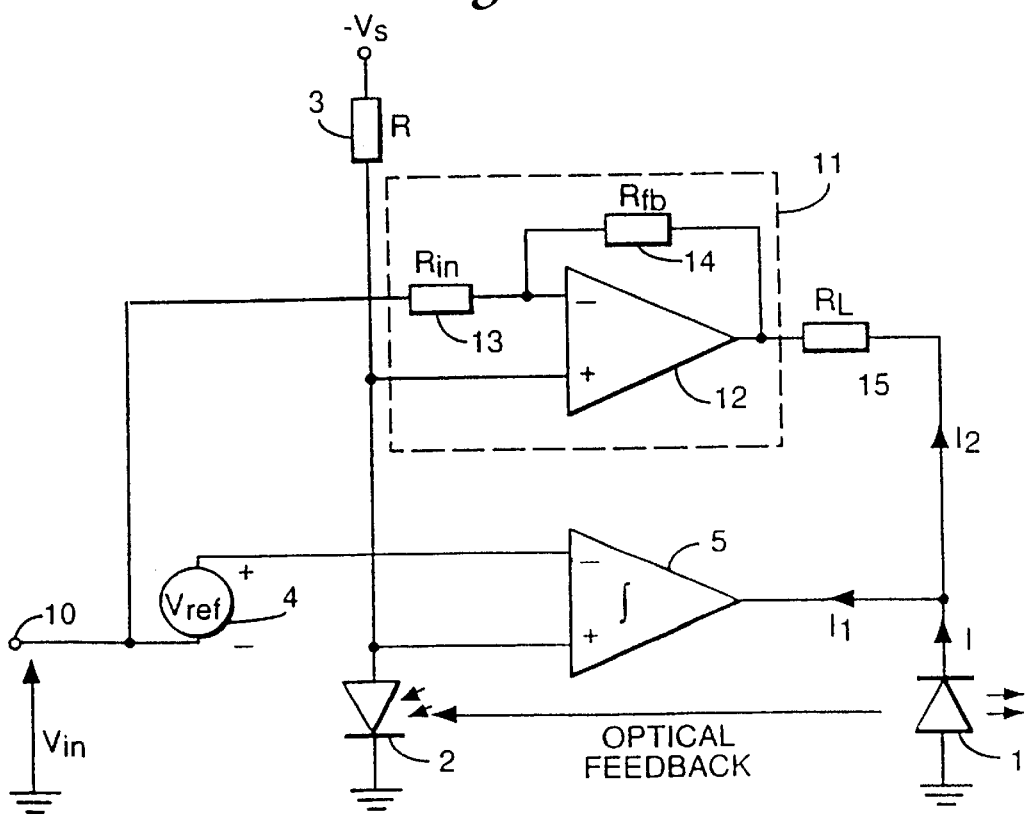
FIG. 4 is a schematic circuit diagram of a first embodiment of a laser driven circuit according to the invention.
Figure 2:
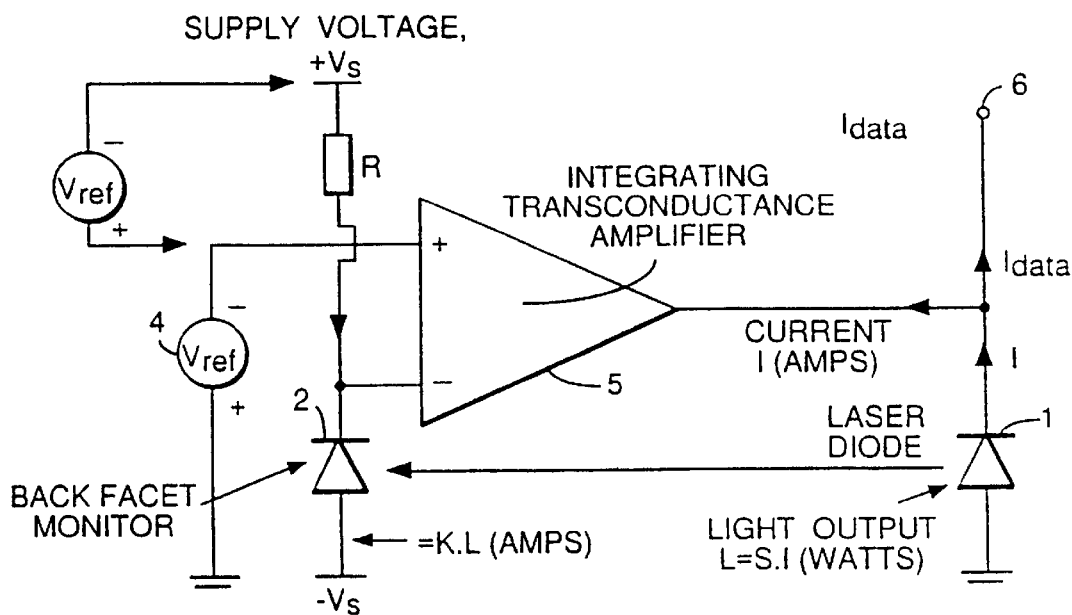
Figure 3:
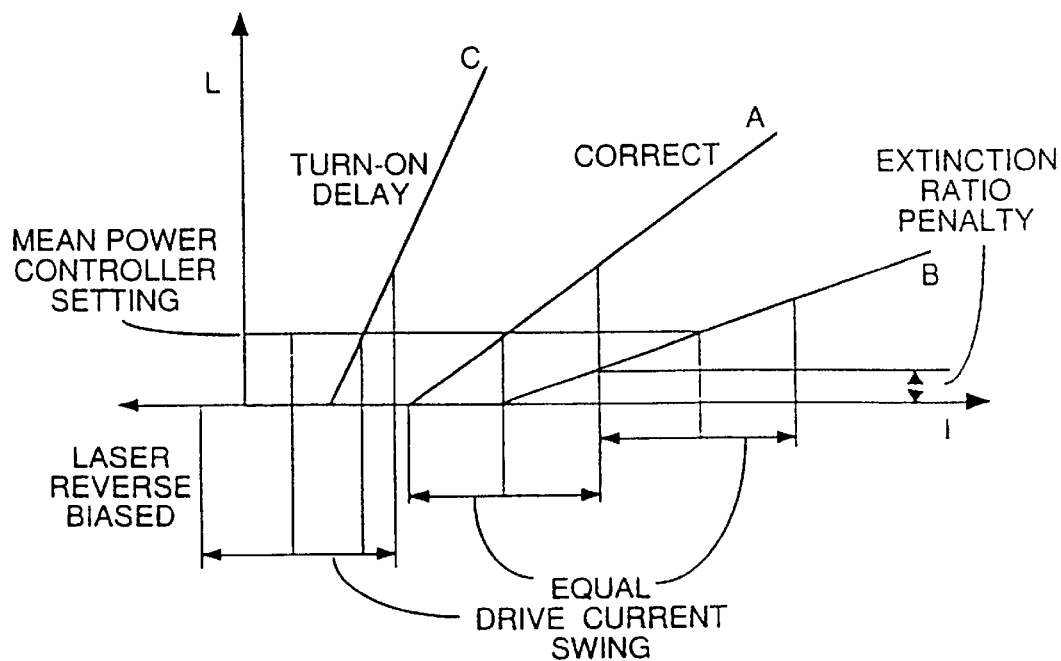

The embodiment of FIG. 4 is not in a convenient form for implementation, as the reference voltage is in series with the data signal. Moreover the photodiode is shunted by the inputs of both amplifiers, which may cause degradation of performance if the transconductance amplifier 5 has—as is typical for low-bandwidth d.c. amplifiers—a low impedance at radio frequencies. A more practical version is shown in FIG. 5.

Figure 5:
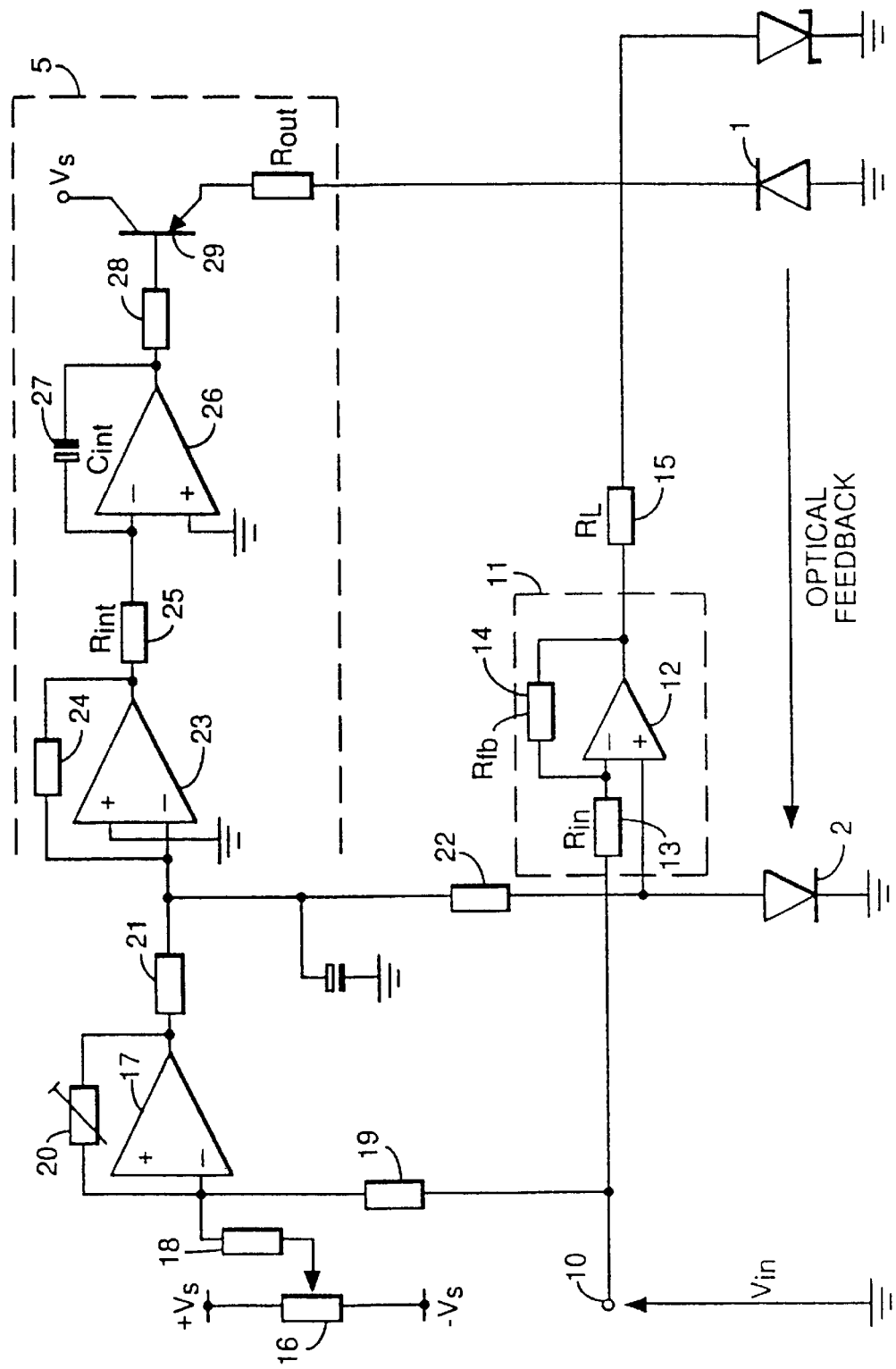
FIG. 5 is a schematic circuit diagram of a second embodiment of the invention.

In FIG. 5, components identical in function to those in FIG. 4 are given the same reference numerals. The reference voltage is generated by a potentiometer 16, and is added to the input voltage $V_{in}$ by means of an amplifier 17 with input resistors 18,19 for the reference voltage and $V_{in}$ respectively, and a variable feedback resistor 20 for adjusting gain and hence d.c. balance. Owing to inversion in this amplifier, the reference and input voltages are now applied to the same polarity input of the amplifier 5 as is the feedback signal from the photodiode 2, albeit via separate input resistors 21,22. The amplifier 5 has a first operational amplifier 23, with a feedback resistor 24, feeding via a resistor 25, value $R_{int}$, a second such amplifier 26 which has a feedback capacitor 27 of value $C_{int}$ to form an integrator. This drives via a resistor 28 an emitter follower pnp transistor 29 which supplies current via a resistor $R_{out}$ to the laser diode 1.

The construction of the wideband amplifier is unchanged; however note that the photodiode 2 now operated in photovoltaic mode, and drives the wideband amplifier 11 directly and the first stage 23 of the integrating amplifier 5 via the resistor 22, avoiding excessive loading of the diode by the input of this stage. A capacitor is also connected from the inverting input of the amplifier 23, to avoid excessive R.F. currents at the amplifier input.

The wideband amplifier 12 may be a high-performance operational amplifier such as type HFA1100 manufactured by Harris Corporation or CLC401 from Comlinear Corporation. With the HFA1100 good results were obtained at data rates up to 300 Mbit/s. The others (17,23 and 26) require good d.c. stability but their frequency response is not critical. The CA3140 BiMOS op-amp is suitable.

The cut-off frequency of the amplifier 5 is $f=GKRS/2\pi$, where $G=1/(C_{int} R_{int} R_L)$.

Noting that the amplifier 17 and associated components is outside the feedback loop, it is necessary to adjust the gain by means of the d.c. balance control 20 so that the transfer function for the data is equivalent both at high and low frequencies. One possible adjustment procedure is as follows:

(a) with a data input of zero volts, set d.c. balance to a nominal starting value with resistor 20 and set threshold with potentiometer 16 at zero volts;

(b) observing the laser light output using a d.c. coupled monitor, adjust the threshold control 16 so that the laser operating point is well into the lasing region;

(c) apply a 0 to 0.5 volt asymmetrical data signal at 300 Mbit/s to the data input (e.g. a single mark followed by 100 spaces), followed by the inverse sequence and adjust the d.c. balance control 20 until no baseline shift is seen on the monitor upon repeated switching between the two signals;

(d) readjust the threshold control 16 until a 0 volt data input signal corrsponds to laser bias just at threshold.

Typical component values for the circuit of FIG. 5 are as follows:

| Reference | Value Symbol | Value |
|---|---|---|
| 13 | $R_{in}$ | 100Ω |
| 14 | $R_{fb}$ | 510Ω |
| 15 | $R_L$ | 75Ω |
| 16 | | 50 kΩ |
| 18 | | 100 kΩ |
| 19 | | 10 kΩ |
| 20 | | 50 kΩ (nominal) |
| 21 | | 2 kΩ |
| 22 | | 51Ω |
| 24 | | 2 kΩ |
| 25 | $R_{int}$ | 10 kΩ |
| 27 | $C_{int}$ | 1 μf |
| 28 | | 1 kΩ |
| 30 | $R_{out}$ | 75Ω |

What is claimed is:

1. A laser driver comprising:

a data input for receiving data signals;

means for providing a feedback signal representative of the laser light output;

a first amplifier having gain at d.c. and low frequencies connected to receive the data signals, a d.c. reference signal and the feedback signal to provide current to the laser; and a second amplifier having gain at higher frequencies connected to receive the data signals and the feedback signal to provide current to the laser.

2. A laser driver as in claim 1 in which:

the first amplifier is an integrating amplifier having below a threshold frequency, a higher gain than the second amplifier and, above the threshold frequency, a lower gain than the second amplifier.

3. A laser driver as in claim 1 having:

gain adjustment means whereby the gain provided by the driver to data signals may be rendered equal at d.c. and at a frequency above the passband of the first amplifier.

4. A laser driver as in claim 2 having:

gain adjustment means whereby the gain provided by the driver to data signals may be rendered equal at d.c. and at a frequency above the passband of the first amplifier.

5. A method for driving a laser, said method comprising:

receiving data signals;

providing a feedback signal representative of the laser light output;

amplifying the data signals with a first amplifier having gain at d.c. and low frequencies providing current to the laser using a d.c. reference signal and the feedback signal; and using a second amplifier having gain at higher frequencies to receive the data signals and the feedback signal to provide current to the laser.

6. A method as in claim 5 wherein:

the first amplifier is an integrating amplifier having, below a threshold frequency, a higher gain than the second amplifier and, above the threshold frequency, a lower gain than the second amplifier.

7. A method as in claim 5 further comprising:

adjusting the gain provided by the driver to data signals to render it equal at d.c. and at a frequency above the passband of the first amplifier.

8. A method as in claim 6 comprising:

adjusting the gain provided by the driver to data signals to render it equal at d.c. and at a frequency above the passband of the first amplifier.

* * * * *